United States Patent [19]

Matsushita et al.

[11] 4,203,780
[45] May 20, 1980

[54] FE ION IMPLANTATION INTO SEMICONDUCTOR SUBSTRATE FOR REDUCED LIFETIME SENSITIVITY TO TEMPERATURE

[75] Inventors: Takeshi Matsushita, Sagamihara; Takayoshi Mamine, Tokyo; Hisao Hayashi, Atsugi; Kazuo Nishiyama, Yamato, all of Japan

[73] Assignee: Sony Corporation, Tokyo, Japan

[21] Appl. No.: 936,104

[22] Filed: Aug. 23, 1978

[51] Int. Cl.$^2$ .................. H01L 21/263; H01L 29/167
[52] U.S. Cl. ........................................ 148/1.5; 357/64; 357/91
[58] Field of Search ...................... 357/91, 64; 148/1.5

[56] References Cited

U.S. PATENT DOCUMENTS

| 3,502,515 | 3/1970 | McMullen et al. | 148/175 |
| 3,988,772 | 10/1976 | Krishna | 357/64 |

OTHER PUBLICATIONS

Abdugafurova et al., ". . . Iron-doped Si", Sov. Phys. Semicond., 8 (1975), 1409 (English).
Abdugafurova et al., ". . . Fe-doped P-type Si", Sov. Phys. Semicond., 9 (1975), 450 (English).
Dearnaley et al., (ed.), "Ion Implantation", North-Holland, 1973, pp.462–463.
Chadderton et al., ". . . Cu-Ion Impl. of Si . . .".

Primary Examiner—L. Dewayne Rutledge
Assistant Examiner—Upendra Roy
Attorney, Agent, or Firm—Hill, Van Santen, Steadman, Chiara & Simpson

[57] ABSTRACT

A method of an iron Fe ion implantation into a semiconductor substrate of an N-type conductivity is disclosed. The method comprises the steps of implanting Fe ions into an N-type semiconductor substrate from its one surface with the dose amount of $10^{10}$ to $10^{15}$ cm$^{-2}$ and heat-treating the semiconductor substrate with Fe ions at 850° to 1250° C. to control the lifetime of the minority carrier in the substrate and hence to reduce the temperature dependency of the lifetime.

8 Claims, 3 Drawing Figures

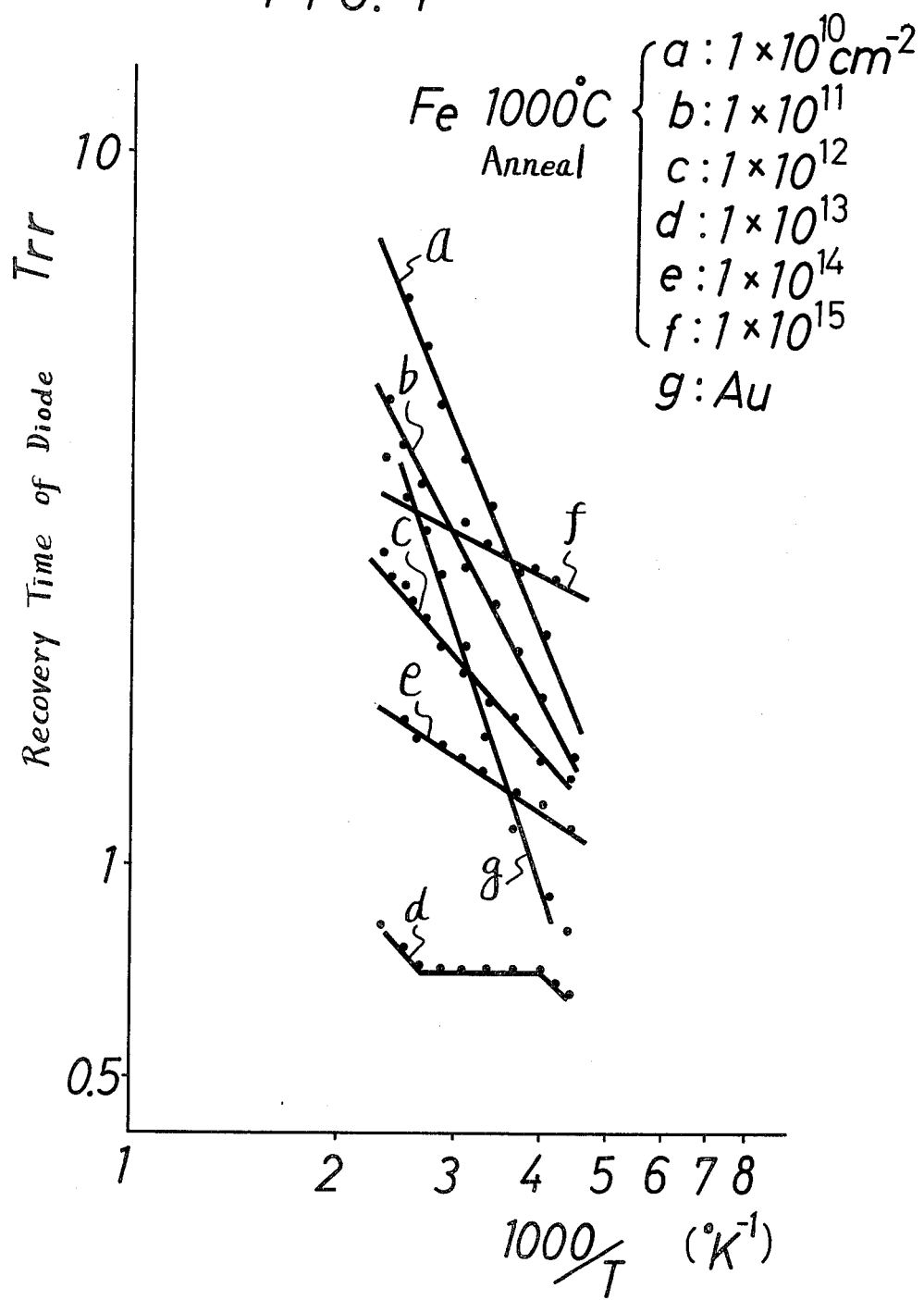

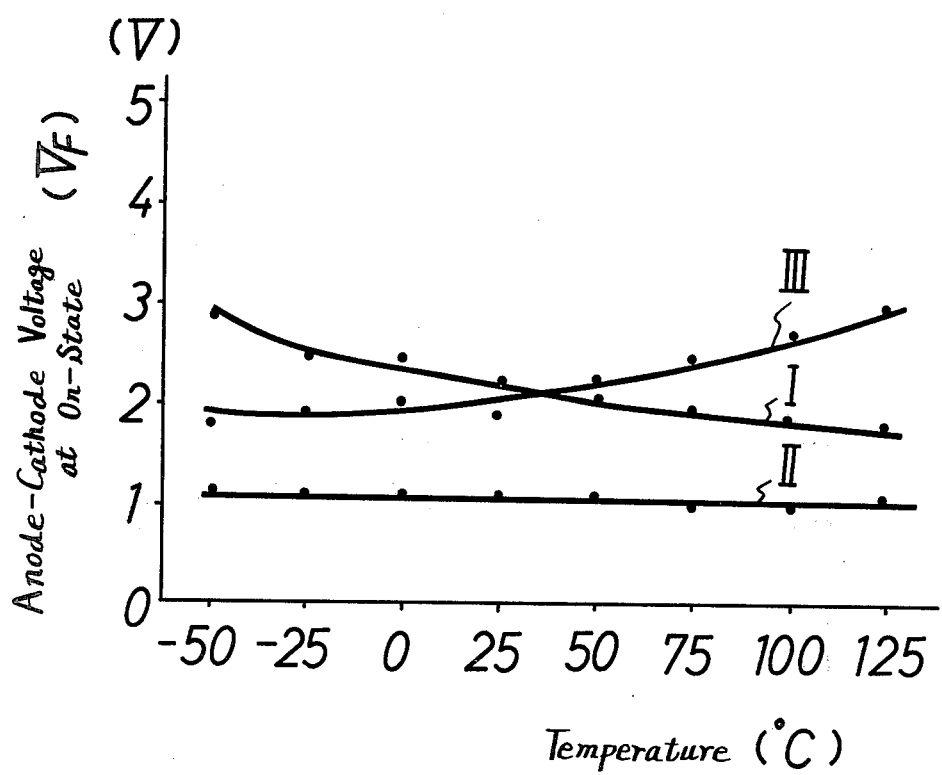

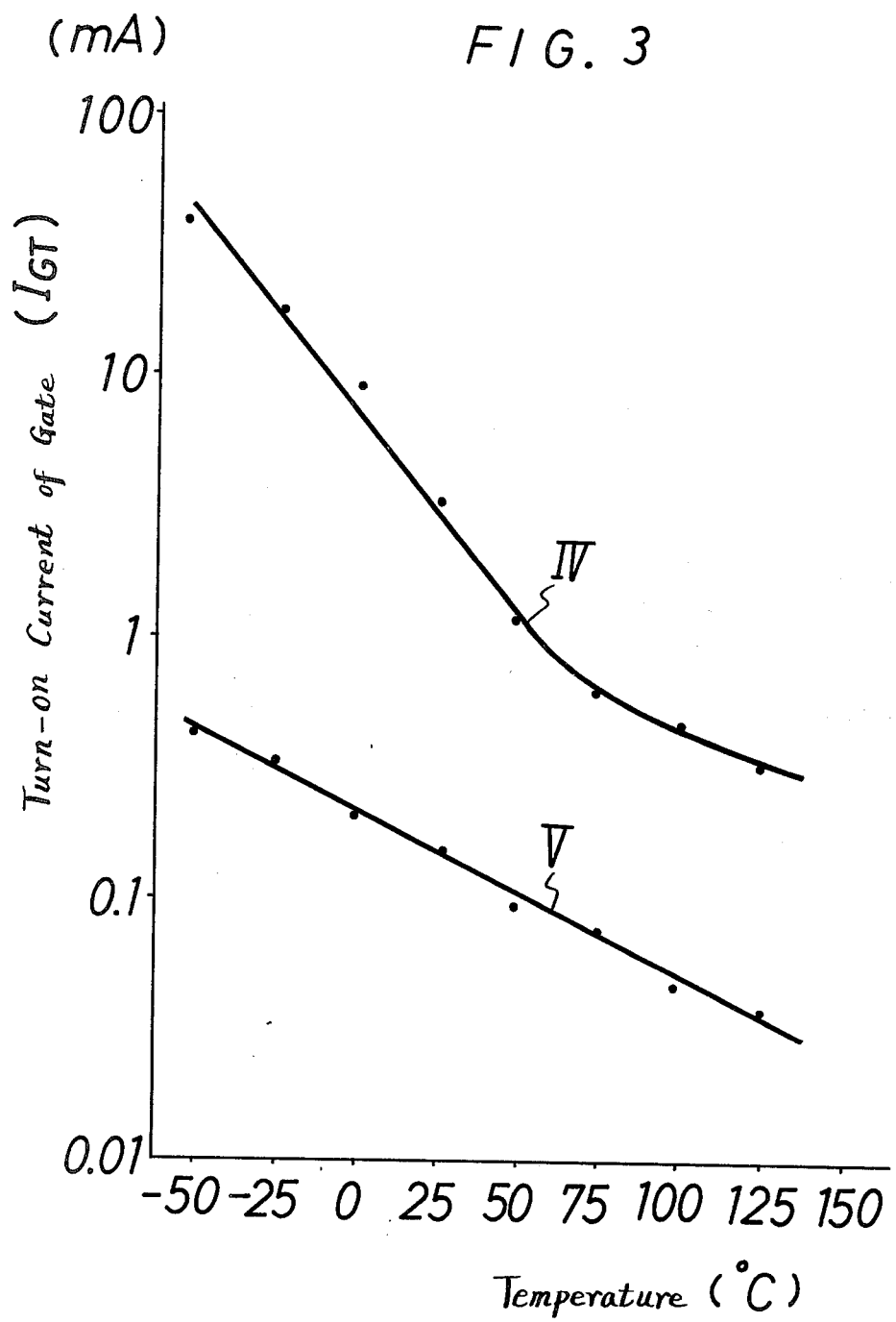

FE ION IMPLANTATION INTO SEMICONDUCTOR SUBSTRATE FOR REDUCED LIFETIME SENSITIVITY TO TEMPERATURE

BACKGROUND OF THE INVENTION

1. Field of the Invention

The present invention relates generally to a method of an iron Fe ion implantation into a semiconductor substrate and is directed more particularly to a novel method of Fe ion implantation into a semiconductor substrae of an N-type conductivity with which the lifetime of minority carriers can be controlled effectively.

2. Description of the Prior Art

If the temperature dependency of the lifetime of minority carriers in a semiconductor, for example those manufactured out of silicon crystals can be reduced, when the semiconductor may be advantageously used as various semiconductor devices, especially transistors, diodes, thyristors, etc., which may be used with large amounts of electric power.

The art, for example, U.S. Pat. No. 3,953,243 shows the control for the lifetime by utilizing gold, (Au). Recently, platinum, (Pt), has been used for the same purpose. Au and Pt have great temperature dependency characteristics when used as a lifetime reducer. When they are doped into a semiconductor substrate of an N- or P-type conductivity, they become an acceptor or donor, increasing the resistivity of the semiconductor substrate thereby and hence reducing the current capacity of a semiconductor device.

OBJECTS AND SUMMARY OF THE INVENTION

It is an object of the present invention to provide a method of Fe ion implantation into a semiconductor substrate with which the lifetime of a minority carrier in a semiconductor crystalline such as a silicon substrate can be controlled with high reproducibility.

It is another object of the invention to provide a method of Fe ion implantation into a semiconductor substrate of an N-type conductivity by which the temperature dependency of the lifetime of a minority carrier in the N-type semiconductor substrate can be reduced and the resistivity thereof can be prevented from being varied to produce various semiconductor devices with high quality.

According to an aspect of the present invention there is provided a method of Fe ion implantation into a semiconductor substrate of an N-type conductivity which comprises the steps of implanting Fe ions into a semiconductor substrate of an N-type conductivity from its surface with the dose amount of $10^{10}$ to $10^{15}$ cm$^{-2}$, and heat-treating the semiconductor substrate having Fe ions therein at 850° to 1250° C.

The other objects, features and advantages of the present invention will become apparent from the following description taken in conjunction with the accompanying drawings.

BRIEF DESCRIPTION OF THE DRAWINGS

FIG. 1 is a graph showing a temperature to recovery time characteristic of a diode used for explaining the present invention;

FIG. 2 is a graph showing characteristics of a voltage $V_F$ between the anode and cathode of a gate controlled switching element to temperature when the gate controlled switching element is switched on, which is used for the explanation of the present invention; and FIG. 3 is a graph showing a gate turn-on current to temperature characteristic of a similar gate controlled switching element.

DESCRIPTION OF THE PREFERRED EMBODIMENT

An example of the present invention will be hereinafter described.

In the method of Fe ion implantation into a semiconductor substrate of an N-type conductivity according to the invention, there is used iron Fe as a lifetime killer which controls the lifetime of a minority carrier in a semiconductor crystal such as a silicon substrate of an N-type conductivity. It is known from Phys. Stat. Sol. (a) 10, K53 and K133 (1972) to use Fe as the life time killer. Since Fe is easily oxidized, when Fe is vaporized and then diffused as in the prior art, the oxidation of Fe at vaporization becomes a problem. With the invention, in order to control the concentration of Fe, which serves as the center of recombination, with high reproducibility, Fe ion is implanted into a semiconductor crystalline by the ion implantation method, and the dose amount of the implanted Fe ion and the annealing temperature i.e. diffusing temperature of the implanted Fe ion are controlled to reduce the temperature dependency of the lifetime of the minority carrier in the semiconductor. Since the Fe ion is lighter than the Au ion, the Fe ion implantation can be easily carried out.

The method of the present invention is especially suitable to control the lifetime of the minority carrier in an N-type semiconductor crystal such as a silicon substrate of the N-type conductivity. Since Fe atom serves as only a donor in a silicon semiconductor, Fe acts much different from Au and Pt. By way of example, when an Fe atom is doped into an N-type silicon semiconductor substrate, since the Fe atom is a donor and hence neutral, this means that the temperature dependency of lifetime is very small.

In general, it can be considered that the life time $\tau$ is given by the following equation (1).

$$\tau = \frac{1}{Nt\,\sigma_v} \quad (1)$$

where Nt represents the density of the trap center, $\delta$ is the trap cross-sectional area and v is the heat velocity, respectively.

In general, the temperature dependence of the factors $\delta$ and v are considered as follows:

$\delta(T) \alpha T^{-n} (n=0, 1, 2, \text{---})$ $v(T) \alpha T^{\frac{1}{2}}$ where T represent temperature.

Accordingly, the temperature dependence of the lifetime $\tau$ can be expressed as follows:

$\tau \alpha T^{n-\frac{1}{2}}$

The iron atoms (Fe) are diffused into, for example, an N-type silicon semiconductor forming a deep donor level. This doner level includes electrons, so that it is neutral respect to the electrical charge. The trap cross-sectional area $\delta$ of a neutral level is less dependent on temperature. The temperature dependence of the trap cross-sectional area $\delta_{Fe}$ which includes Fe atoms doped thereinto is expressed as follows:

$\delta_{Fe} \alpha T^0 \sim T^{-1}$

Therefore, the lifetime $\tau_{Fe}$ of this case is expressed as follows:

$$\tau_{Fe} \alpha T^{-\frac{1}{2} \sim \frac{1}{2}}$$

The above expression means that the temperature dependence of the lifetime $\tau_{Fe}$ of the case with the Fe atoms doped thereinto according to the disclosed method becomes small.

Where, under current practice, Au is used, the Au atoms, diffused into an N-type silicon semiconductor, form a deep acceptor level. This deep acceptor level traps electrons becomes negatively charged, so that this negative acceptor level traps holes. As temperature becomes high, the trap cross-sectional area $\delta_{Au}$ with implanted or doped Au decreases. In general, the temperature dependency of the trap cross-sectional area $\delta_{Au}$ is expressed as follows:

$$\delta_{Au} \alpha T^{-2} \sim T^{-4}$$

And hence, the temperature dependency of the lifetime $\tau_{Au}$ of this case becomes as follows:

$$\tau_{Au} \alpha T^{1.5} \sim T^{3.5}$$

This expression means that the temperature dependency of lifetime $\tau_{Au}$ is rather great.

In the present invention, therefore, iron ions i.e. $^{56}$Fe ions (or isotope $^{57}$Fe ions) are implanted by the ion implantation method into the surface of a semiconductor crystal such as an N-type silicon semiconductor substrate, in which the lifetime of the minority carrier must be controlled. In this case, the dose amount of $^{56}$Fe ions (or $^{57}$Fe ions) is desired to be selected within the range of $1 \times 10^{10}$ to $1 \times 10^{15}$ cm$^{-2}$, and more preferably $1 \times 10^{10}$ to $1 \times 10^{-2}$. If the dose amount selected is greater than $1 \times 10^{15}$ cm$^{-2}$, the trapping amount of the minority carriers becomes less and hence Fe is deposited. If the dose amount selected is less than $1 \times 10^{10}$ cm$^{-2}$, the effect is reduced. By way of example, 100 KeV can be used as the acceleration energy for the ion implantation but it is not necessary to limit the acceleration energy to this value. The $^{56}$Fe ion is produced by reacting the metallic iron with CCl$_4$ or SnCl$_4$ to produce FeCl$_3$, and then the FeCl$_3$ is heated to a temperature between 400° C. to 500° C. for vaporization to a gas.

After the $^{56}$Fe ion or ($^{57}$Fe ion) is implanted into the silicon substrate from its surface, the substrate is subjected to an annealing treatment. It is sufficient to select an annealing temperature within the range of 850° C. to 1250° C., but is preferably within the range of 950° C. to 1100° C. When the annealing treatment is carried out at high temperature, the trap concentration tends to be reduced.

The deep level formed by Fe ion implantation is different from that formed by the prior art ion diffusion. With the prior art method, a donor type level is formed at the position under the conduction band by 0.55 eV and above the valence band by 0.4 eV. While, according to the method of the present invention, the donor type level is formed at the position under the conduction band by 0.58 eV and above the valence band by 0.30 eV. In this case, a level is formed under the conduction band by 0.27 eV, but its type is not clear.

According to the invention it is possible that after the Fe ion is implanted into the silicon substrate, Au, Pt and so on can be diffused into the same substrate.

FIG. 1 is a graph showing temperature characteristics of the lifetime of the minority carrier in a diode, which is made by the method of the invention, evaluated by the recovery time $T_{rr}$ of the diode. In the graph of FIG. 1, curves a, b, c, d, e, and f represent the characteristics of the diodes made by the present invention where the annealing temperature is selected constant at 1000° C. but the dose amount of Fe ions is selected as $1 \times 10^{10}$ cm$^{-2}$, $1 \times 10^{11}$ cm$^{-2}$, $1 \times 10^{13}$ cm$^{-2}$, $1 \times 10^{14}$ cm$^{-2}$ and $1 \times 10^{15}$ cm$^{-2}$, respectively, and a curve g represents the characteristic of a prior art diode into which Au is doped. From the graph of FIG. 1, it is noted that the temperature characteristic of the recovery time $T_{rr}$ of the diode made by the present invention is improved as compared with the prior art diode which has Au doped thereinto.

According to experiments, when the dose amount of Fe ions and the annealing temperature of a diode and gate controlled switching element (GCS), which has Fe doped thereinto according to the method of present invention, are controlled suitably under the above range, such a diode whose recovery time $T_{rr}$ is lowered at high temperature (this diode is different from the prior art diode having Au doped thereinto) or whose recovery time $T_{rr}$ is not varied within the temperature range of $-50°$ C. to 150° C. is obtained. While, in case of the GCS, there is obtained such one whose voltage $V_F$ between the anode and cathode thereof increases at high temperature but decreases at low temperature (which is opposite to the prior art GCS having Au doped thereinto in tendency) or whose voltage $V_F$ is not changed within the temperature range of $-50°$ C. to 150° C.

FIG. 2 is a graph showing temperature characteristics of the voltages $V_F$ of a GCS made by the method of the invention which has Fe doped thereinto and a prior art GCS having Au doped thereinto. In the graph of FIG. 2, a curve I represents the case of a prior art GCS into which Au is diffused at 890° C., and curves II and III represent the cases of GCSs, which have Fe doped thereinto and annealed at temperatures of 950° C. and 1000° C., respectively, of this invention.

FIG. 3 is a graph showing the temperature characteristics of the turn-on current $I_{GT}$ of a GCS having Fe doped thereinto according to the present invention and that of a prior art GCS having Au doped thereinto, in which a curve IV represents the case of the prior art GCS to which Au is diffused at 890° C. and a curve V represents the case of the GCS made by the present invention which is annealed at 950° C.

In the method of the present invention described as above, Fe is used as the lifetime reducer, the Fe is doped into the semiconductor such as a silicon substrate by the ion implantation method, and then the dose amount of Fe and the annealing temperature after ion implantation are then selected to control the lifetime of the minority carrier and to reduce the temperature dependence of the lifetime. Further, since Fe becomes only a donor in an N-type silicon substrate, the resistivity of the substrate is not varied even though the lifetime reducer is doped into the substrate. In addition, since Fe is doped into the semiconductor substrate by the ion implantation method in the invention, the amount of the doped Fe can be a controlled or suppressed constant and hence the reproducibility is superior. As to the reproducibility, it is necessary that a vacancy or an impurities which will act as an acceptor in a silicon semiconductor, are suppressed as much as possible.

Thus, a bipolar semiconductor device having Fe doped thereinto by the ion implantation method according to the present invention is improved much in temperature dependence characteristics as compared with a prior art semiconductor device having Au doped thereinto.

Some of the semiconductor devices of the present invention have the opposite tendency to that of a semiconductor device having Au doped thereinto. Therefore, the present invention is very advantageous in making a semiconductor device for use with large amounts of electric power. An additional benefit for devices manufactured according to the invention, such an effect whereby the temperature dependence is small, is achieved for the collector of an NPN transistor and for the base of an PNP transistor, so that the temperature characteristic of the storing time is improved in the NPN transistor and the temperature characteristic of the current amplification factor $h_{FE}$ is improved in the PNP transistor.

Further, the present invention can be utilized in various aspects such as to control the current gain of a power transistor, GCS and silicon controlled rectifier, and also to improve the switching characteristic of a diode.

It will be apparent that many modifications and variations could be effected by one skilled in the art without departing from the spirit or scope of the novel concepts of the present invention, so that the spirit or scope of the invention should be determined by the appended claims only.

We claim as our invention:

1. A method of Fe ion implantation into a semiconductor substrate of an N-type conductivity having a reduced lifetime sensitivity to temperatures comprising the steps of:
   (a) implanting Fe ions into a semiconductor substrate of an N-type conductivity from its surface with a dose amount of $10^{10}$ to $10^{15}$ cm$^{-2}$;
   (b) heat-treating said semiconductor substrate having Fe ions therein at 850° to 1250° C.

2. A method of Fe ion implantation into a semiconductor substrate of an N-type conductivity as claimed in claim 1, in which said semiconductor substrate is a silicon substrate.

3. A method of Fe ion implantation into a semiconductor substrate of an N-type conductivity as claimed in claim 1, in which said dose amount is selected within a range of $10^{12}$ to $10^{14}$ cm$^{-2}$.

4. A method of Fe ion implantation into a semiconductor substrate of an N-type conductivity as claimed in claim 1, in which said heat-treating temperature is selected within a range of 950° to 1100° C.

5. A method of Fe Ion implantation into a semiconductor substrate of an N-type conductivity as described in claim 1, in which the Fe ions are an isotope of iron.

6. A method of Fe Ion implantation into a semiconductor substrate of an N-type conductivity as described in claim 1, in which the implanted ions are $^{56}$Fe Ions.

7. A method of Fe Ion implantation into a semiconductor substrate of an N-type conductivity as described in claim 1, in which the implanted ions are $^{57}$Fe Ions.

8. In a method of Fe Ion implantation into a semiconductor substrate of an N-type conductivity as described in claim 1, an additional step which comprises:
   producing the Fe ions for use in implantation from $FeCl_3$.

* * * * *